US010418364B2

(12) United States Patent
Baars et al.

(10) Patent No.: US 10,418,364 B2
(45) Date of Patent: Sep. 17, 2019

(54) SEMICONDUCTOR DEVICE STRUCTURE WITH SELF-ALIGNED CAPACITOR DEVICE

(71) Applicant: GLOBALFOUNDRIES Inc., Grand Cayman (KY)

(72) Inventors: Peter Baars, Dresden (DE); Hans-Jürgen Thees, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/252,995

(22) Filed: Aug. 31, 2016

(65) Prior Publication Data
US 2018/0061839 A1   Mar. 1, 2018

(51) Int. Cl.
| | |
|---|---|
| *H01L 27/108* | (2006.01) |
| *H01L 21/285* | (2006.01) |
| *H01L 21/762* | (2006.01) |
| *H01L 21/84* | (2006.01) |
| *H01L 27/12* | (2006.01) |
| *H01L 29/06* | (2006.01) |
| *H01L 29/08* | (2006.01) |

(Continued)

(52) U.S. Cl.
CPC .. *H01L 27/10811* (2013.01); *H01L 21/28518* (2013.01); *H01L 21/76283* (2013.01); *H01L 21/76897* (2013.01); *H01L 21/84* (2013.01); *H01L 23/485* (2013.01); *H01L 27/10873* (2013.01); *H01L 27/1203* (2013.01); *H01L 28/82* (2013.01); *H01L 29/0649* (2013.01); *H01L 29/0847* (2013.01); *H01L 29/161* (2013.01); *H01L 29/165* (2013.01); *H01L 29/1608* (2013.01); *H01L 29/45* (2013.01); *H01L 29/66545* (2013.01); *H01L 29/66651* (2013.01); *H01L 29/7838* (2013.01); *H01L 29/7848* (2013.01); *H01L 27/0629* (2013.01); *H01L 27/1085* (2013.01)

(58) Field of Classification Search
None
See application file for complete search history.

(56) References Cited

U.S. PATENT DOCUMENTS 6,057,572 A  *  5/2000 Ito ........................ H01L 27/0629
                                                                257/296
6,466,427 B1 * 10/2002 Chen ....................... H01L 28/56
                                                                257/303

(Continued)

*Primary Examiner* — Abul Kalam
(74) *Attorney, Agent, or Firm* — Amerson Law Firm, PLLC

(57) ABSTRACT

A semiconductor device structure is disclosed including a semiconductor-on-insulator (SOI) substrate, the SOI substrate comprising a semiconductor layer, a substrate material and a buried insulating material layer positioned between the semiconductor layer and the substrate material, a trench isolation structure positioned in at least a portion of the SOI substrate, the trench isolation structure defining a first region in the SOI substrate, and a capacitor device formed in the first region, the capacitor device comprising a first electrode formed by a conductive layer portion formed in the first region on the buried insulating material layer, the conductive layer portion at least partially replacing the semiconductor layer in the first region, a second electrode formed over the first electrode, and an insulating material formed between the first electrode and the second electrode.

10 Claims, 7 Drawing Sheets

(51) Int. Cl.
*H01L 29/16* (2006.01)
*H01L 29/161* (2006.01)
*H01L 29/165* (2006.01)
*H01L 29/45* (2006.01)
*H01L 29/66* (2006.01)
*H01L 29/78* (2006.01)
*H01L 49/02* (2006.01)
*H01L 21/768* (2006.01)
*H01L 23/485* (2006.01)
*H01L 27/06* (2006.01)

(56) References Cited

U.S. PATENT DOCUMENTS

| | | |
|---|---|---|
| 7,768,099 B2 | 8/2010 | Oates et al. |
| 7,820,505 B2 * | 10/2010 | Brederlow ............ H01L 21/845 257/E21.011 |
| 8,709,890 B2 | 4/2014 | Cheng et al. |
| 8,748,258 B2 | 6/2014 | Cheng et al. |
| 9,070,788 B2 * | 6/2015 | Cheng ................. H01L 27/0629 |
| 2003/0072126 A1 * | 4/2003 | Bhattacharyya ....... B82Y 10/00 361/311 |
| 2003/0132475 A1 * | 7/2003 | Kanamori ......... H01L 21/76264 257/306 |
| 2006/0022302 A1 * | 2/2006 | Brederlow ............. H01L 21/84 257/532 |
| 2006/0033139 A1 * | 2/2006 | Masuoka ........... H01L 27/0629 257/296 |
| 2006/0197134 A1 * | 9/2006 | Phan ...................... H01L 28/40 257/306 |
| 2007/0267705 A1 * | 11/2007 | Won ........................ H01L 28/60 257/379 |
| 2008/0173978 A1 * | 7/2008 | Tu .......................... H01G 4/002 257/532 |
| 2009/0230474 A1 | 9/2009 | Clark, Jr. et al. |
| 2013/0175596 A1 * | 7/2013 | Cheng ................ H01L 27/0629 257/310 |
| 2013/0178021 A1 * | 7/2013 | Cheng ................ H01L 27/0629 438/155 |

* cited by examiner

SEMICONDUCTOR DEVICE STRUCTURE WITH SELF-ALIGNED CAPACITOR DEVICE

BACKGROUND OF THE INVENTION

1. Field of the Invention

The present disclosure relates to a semiconductor device structure and a method, and, more particularly, to a semiconductor device structure having a self-aligned capacitor device in advanced SOI technologies and a method of forming an according semiconductor device structure at advanced technology nodes.

2. Description of the Related Art

In the ongoing task to comply with constraints imposed by Moore's Law, FDSOI ("fully depleted silicon-on-insulator") seems to be a promising candidate for next generation technologies in the fabrication of semiconductor devices at technology nodes of 22 nm and beyond. Aside from FDSOI allowing the combination of high performance and low power consumption, complemented by an excellent responsiveness to power management design techniques, fabrication processes as employed in FDSOI techniques are comparatively simple and actually represent a low risk evolution of conventional planar bulk CMOS techniques when compared to multidimensional semiconductor devices, such as FinFETs.

In general, SOI (Semiconductor-On-Insulator) techniques make use of a special kind of substrate being formed by a semiconductor or active layer, such as silicon, germanium or silicon germanium, formed on a buried insulation (oxide— (BOX)) layer, which is in turn formed on a bulk semiconductor substrate. For example, in the case of an N-type SOI device, a P-type semiconductor film is sandwiched between a gate oxide (GOX) and the BOX layer. Conventionally, there are two types of SOI devices: PDSOI (partially depleted SOI) devices and FDSOI (fully depleted SOI) devices, where the thickness of the BOX layer is greater in PDSOI (about 150 nm) than in FDSOI (20-30 nm). The thickness of the semiconductor layer disposed on the BOX layer is significantly thinner in FDSOI than in PDSOI, i.e., 5-15 nm in FDSOI and about 60-80 nm in PDSOI. The type of FET device, that is NFET or PFET, is defined in FDSOI by the workfunction of the high-k metal gate stack and the doping of the epitaxially grown raised source/drain (RSD) regions (NFET: P-doped Si epitaxy; PFET: B-doped SiGe epitaxy). PFET devices may optionally have an SiGe channel.

Generally, the channel of FDSOI devices is fully depleted and does not depend on the type of substrate. Particularly, a channel implantation is not performed, though the thin semiconductor film on the BOX layer of FDSOI substrates is typically weakly P-doped, but this is not important in FDSOI technology.

Aside from transistor devices (mostly MOSFET devices) representing main components of integrated circuits, passive devices, such as capacitors, are often employed in integrated circuits. For example, decoupling capacitors are required for stabilizing a chip's power supply and reducing noise, while routing effects in metallization layers may be overcome and signal integrity may be improved when using a decoupling capacitor which provides a good return path. In another example, capacitors may be employed in memory cells representing fundamental building blocks of memories in computer devices.

In general, a memory cell is an electric circuit storing one bit of binary information. A memory cell may be set to store a logic "1" (high voltage level) and reset to store a logic "0" (low voltage level). The value of a memory cell is maintained and stored until it is changed by a setting or resetting process. In a reading process, the value of a memory cell is accessed and read out.

A type of memory is given by dynamic random access memory (DRAM). Memory cells of the DRAM type comprise a capacitor within an integrated circuit, the capacitor being used for storing a bit of data. Particularly, the capacitor can either be charged or discharged, taken to represent logic states, that is, the two values of a bit. However, as the layout of memory cells of the DRAM type has a smaller layout than compared to, for example, memory cells of the static random access memory type (SRAM), memory cells of the DRAM type can be more densely packed, yielding cheaper memories with greater capacity. Conventionally, SRAM memory is used for on-chip cache included in modern microprocessor chips.

In general, capacitors may be implemented as so-called metal-insulator-metal (MIM) capacitors, wherein two metal electrodes are separated by an insulating material. U.S. Pat. No. 7,768,099 shows an integration of MIM capacitors with a damascene interconnect structure, wherein a damascene interconnect structure is formed together with a MIM capacitor damascene structure through an interlevel dielectric layer disposed over a semiconductor substrate. U.S. Patent Publication No. 2009/0230474 shows a semiconductor device including at least one capacitor formed in varying levels on a semiconductor-on-insulator (SOI) substrate, wherein the at least one capacitor is coupled to the active layer of the SOI substrate. According capacitors are formed during so-called "back-end-of-line" (BEOL) processes, where metal layers are used when forming capacitors, therefore, increasing complexity and density in the routing of metal layers and wasting design and chip resources.

U.S. Pat. No. 8,709,890 shows on-chip capacitors integrated with CMOS transistors employing replacement gate techniques. Herein, the capacitor structures make use of raised source/drain structures adjacent to an electrode of the capacitor, as well as increasing complexity of process flows as to the use of replacement gate techniques.

It is, therefore, desirable to provide a semiconductor device structure having a capacitor device at advanced technology nodes, wherein area consumption is avoided and the complexity of process flows is at least not increased.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides, in a first aspect, a semiconductor device structure. In accordance with some illustrative embodiments herein, the semiconductor device structure may include a semiconductor-on-insulator (SOI) substrate, the SOI substrate comprising a semiconductor layer, a substrate material and a buried insulating material layer positioned between the semiconductor layer and the substrate material, a trench isolation structure positioned in at least a portion of the SOI substrate, and a capacitor device formed in a first region adjacent to the trench isolation structure, the capacitor device comprising a first electrode comprising a conductive layer portion positioned in the first region on the buried insulating material layer, the conductive layer portion at least partially replacing the semiconductor layer in the first region, a second electrode positioned above the first electrode, and an insulating material formed between the first electrode and the second electrode.

The present disclosure further provides, in a second aspect, a method of forming a semiconductor device structure. In accordance with some illustrative embodiments herein, the method may include providing a semiconductor-on-insulator (SOI) substrate, the SOI substrate comprising a semiconductor layer, a substrate material and a buried insulating material layer positioned between the semiconductor layer and the substrate material, forming a trench isolation structure in at least a portion of the SOI substrate, forming an insulating material over a first region adjacent to the trench isolation structure, forming a first electrically conductive material on the insulating material in the first region, and replacing the semiconductor layer in the first region by a second electrically conductive material.

BRIEF DESCRIPTION OF THE DRAWINGS

The disclosure may be understood by reference to the following description taken in conjunction with the accompanying drawings, in which like reference numerals identify like elements, and in which.

Figure 1:
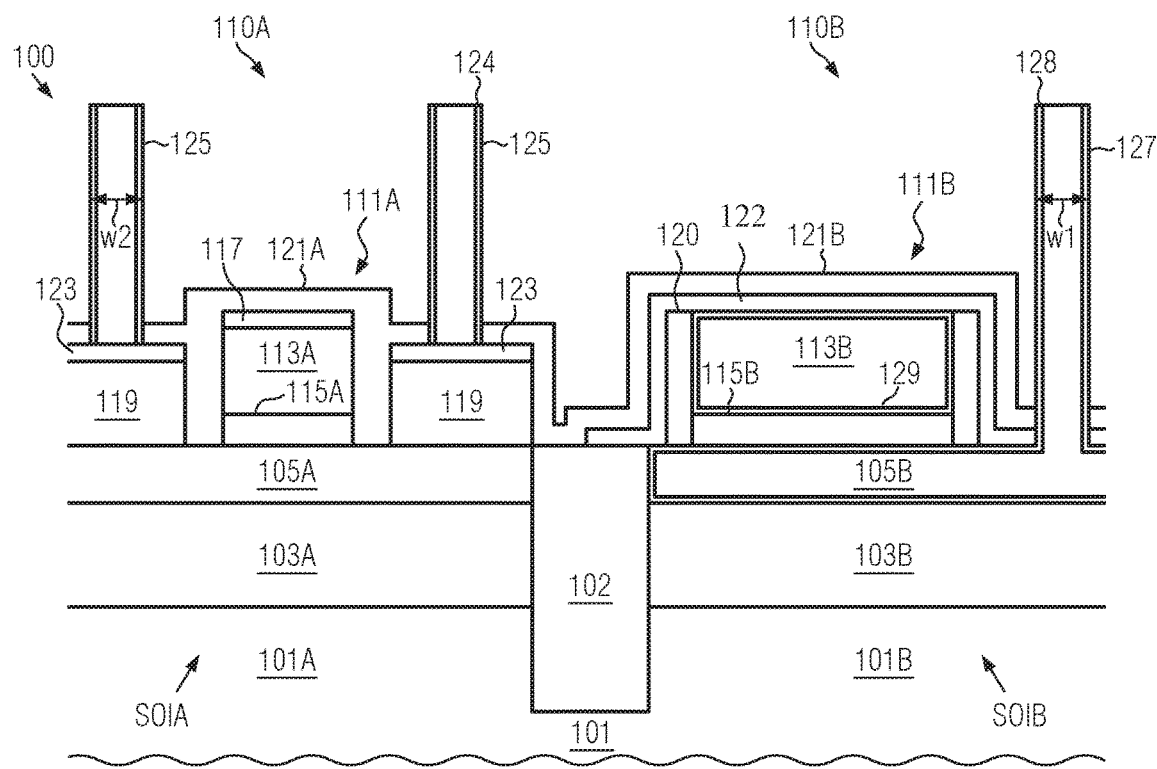
FIG. 1 schematically illustrates a semiconductor device structure in accordance with some illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase. It is pointed out that any enumeration, such as "a first device/structure/element/component/step/process/layer, etc." does not necessarily indicate any prioritization or order, but may mainly denote an enumeration of devices/structures/elements/components/steps/processes/layers, etc. that are mentioned, stated or described before at least one other device/structure/element/component/step/process/layer, etc. is mentioned, stated or described as "a second device/structure/element/component/step/process/layer, etc." and so on.

In various aspects, the present disclosure relates to a semiconductor device structure, wherein the semiconductor device structure is integrated on or in a chip. In accordance with some illustrative embodiments of the present disclosure, the semiconductor device structure may comprise at least one further semiconductor device, e.g., a transistor structure, a capacitor structure and the like.

In various aspects, the present disclosure relates to a capacitor structure, wherein the capacitor structure is integrated on or in a chip. In accordance with some illustrative embodiments of the present disclosure, the capacitor structure may substantially represent a metal-insulator-metal (MIM) structure. When referring to MIM structures, the person skilled in the art will appreciate that, although the expression "MIM structure" is used, no limitation to metal-containing electrode materials is intended as any conductive material may be employed for one or more of the electrodes.

Semiconductor device structures of the present disclosure may concern structures which are fabricated by using advanced technologies, i.e., the semiconductor device structures may be fabricated by technologies applied to approach technology nodes smaller than 100 nm, for example, smaller than 50 nm or smaller than 35 nm, e.g., at 22 nm or below. After a complete reading of the present application, a person skilled in the art will appreciate that, according to some illustrative examples described herein, ground rules smaller or equal to 45 nm, e.g., at 22 nm or below, may be imposed. After a complete reading of the present application, a person skilled in the art will appreciate that, in some embodiments, the present disclosure proposes capacitor structures having minimal length dimensions and/or width dimensions smaller than 100 nm, for example, smaller than 50 nm or smaller than 35 nm or smaller than 22 nm. For example, the present disclosure may provide structures fabricated by using 45 nm technologies or below, e.g., 22 nm or even below.

The fabrication of semiconductor devices comprises front-end-of-line (FEOL) processing, wherein semiconductor devices may be formed directly in and on a substrate. Herein, a raw wafer may be engineered by the growth of an ultrapure, virtually defect-free silicon layer through epitaxy, for example. Some methods may comprise introducing a straining step wherein a silicon variant, such as silicon-germanium (SiGe) or silicon carbide (SiC), is deposited, resulting in an improved electronic mobility. Another method, called semiconductor-on-insulator (SOI) technology, involves the insertion of an insulating layer between a raw wafer and a thin layer of subsequent semiconductor material, resulting in the creation of transistors with reduced parasitic effects. Front-end surface engineering is followed by forming (e.g., growing) a gate dielectric (e.g., silicon dioxide and/or hafnium oxide), forming a gate electrode material on the gate dielectric, patterning of a gate structure, forming source and drain regions, and subsequently implanting and/or diffusing dopants to implement desired electrical properties. In DRAM devices, storage capacitors may also be fabricated at this time, as will be described below with regard to some illustrative embodiments of the present disclosure.

After FEOL processing is completed, so-called back-end-of-line (BEOL) processing is performed, wherein metal interconnecting wires that are isolated by dielectric layers are formed in plural metallization layers formed over the substrate.

In accordance with the present disclosure, substrates may be provided in accordance with FDSOI techniques, wherein a substrate may have a thin (active) semiconductor layer disposed on a buried insulating material layer, which in turn may be formed on a substrate material. In accordance with some illustrative embodiments herein, the semiconductor layer may comprise one of silicon, silicon germanium and the like. The buried insulating material layer may comprise an insulating material, e.g., silicon oxide or silicon nitride. The substrate material may be a base material that is used as a substrate in the art, e.g., silicon, silicon germanium, sapphire and the like. The person skilled in the art will appreciate that, in accordance with complex FDSOI techniques, the semiconductor layer may have a thickness of about 20 nm or less, the buried insulating material layer may have a thickness of about 145 nm or less. In accordance with some advanced technologies, the buried insulating material layer may have a thickness in a range from about 10-30 nm and/or the semiconductor layer may have a thickness of about 6-10 nm.

With regard to FIG. 1, a semiconductor device structure 100 is schematically illustrated in accordance with some illustrative embodiments of the present disclosure. The semiconductor device structure 100 may comprise a semiconductor-on-insulator (SOI) substrate having a substrate material 101, on which a buried insulating material layer (reference numerals 103A, 103B in FIG. 1) and a semiconductor layer (reference numeral 105A in FIG. 1) are disposed such that the buried insulating material layer (103A, 103B in FIG. 1) is interposed between the semiconductor layer (105A in FIG. 1) and the substrate material 101. The SOI substrate may be formed in accordance with known techniques, such as smart-cut or SIMOX techniques.

In accordance with some special illustrative examples, the SOI substrate may be provided in accordance with some advanced technologies as described above, the respective description being included in its entirety by reference.

In accordance with some special illustrative embodiments of the present disclosure, the substrate material 101 may comprise monocrystalline silicon having a plane orientation of (100). Alternatively, the substrate material 101 may be any other appropriate substrate, such as a semiconductor substrate or a non-semiconducting substrate as known in the art. The buried insulating material layer may be formed by a silicon oxide film having a thickness of about 25 nm or less. The semiconductor layer may be, for example, formed by a semiconductor material, such as a silicon comprising material, e.g., silicon. In accordance with some special illustrative examples herein, the semiconductor layer may be P-type monocrystalline silicon having a plane orientation of (100), a crystal orientation of (110) or (100) parallel to an orientation flat or notch. Alternatively, the semiconductor layer may be formed by silicon germanium or the like. In accordance with some illustrative embodiments, the semiconductor layer may have a thickness of 20 nm or less, e.g., about 5-10 nm.

In accordance with some illustrative embodiments of the present disclosure, a trench isolation structure 102 may be formed in the SOI substrate, the trench isolation structure 102 defining a region SOIA and a region SOIB. For example, the trench isolation structure 102 may separate the regions SOIA and SOIB. In accordance with some special illustrative examples, the trench isolation structure 102 may be a shallow trench isolation (STI) and/or may be formed in accordance with STI forming techniques. For example, the SOI substrate may be patterned at an early stage during fabrication and trenches (not illustrated) may be etched into the SOI substrate in accordance with the patterning (not illustrated), the trenches (not illustrated) at least extending through the semiconductor layer and into the buried insulating material. For example, the trench (not illustrated) may at least partially extend into the buried insulating material. In accordance with some non-limiting examples, the trench (not illustrated) may be etched into the buried insulating material to expose an upper surface of the substrate material 101 or may be etched into the substrate material 101. Subsequently, the trench (not illustrated) may be filled by an insulating material, such as silicon oxide and/or silicon nitride.

Referring to FIG. 1, the trench isolation structure 102 may laterally separate an upper portion 101A of the substrate material 101 in the region SOIA and an upper portion 101B of the substrate material 101 in the region SOIB. Furthermore, the trench isolation structure 102 may separate a buried insulating material 103A in the region SOIA and a buried insulating material 103B in the region SOIB. Also, the trench isolation structure 102 may separate and isolate a semiconductor layer 105A in the region SOIA and a conductive layer portion 105B provided in the region SOIB, that is, the semiconductor layer 105A in the region SOIA may be insulated from the conductive layer portion 105B provided in the region SOIB.

In accordance with some illustrative embodiments of the present disclosure, the trench isolation structure 102 may laterally enclose (at least partially) and separate the regions SOIA and SOIB.

Although the trench isolation structure 102 is illustrated as being directly adjacent to each of the regions SOIA, SOIB, this does not pose any limitation to the present disclosure and the person skilled in the art will appreciate that at least one further trench isolation structure (not illustrated) and/or at least one further semiconductor device (not illustrated) may be formed between the regions SOIA, SOIB.

In accordance with some illustrative embodiments of the present disclosure, the conductive layer portion 105B may be formed by an electrically conductive material, e.g., an electrode material as employed in the art when forming electrodes of advanced semiconductor devices at advanced technology nodes, e.g., an electrode metal, e.g., a metal, a metal alloy, tungsten and the like. In accordance with some illustrative embodiments of the present disclosure, the semiconductor layer 105A and the conductive layer portion 105B may be formed by different materials. Alternatively, the semiconductor layer 105A and the conductive layer portion 105B may both be formed by a silicon comprising material and may differ in a level of doping, e.g., a level of conductivity of the conductive layer portion 105B may be substantially higher than a level of conductivity of the semiconductor layer 105A.

In accordance with some illustrative embodiments of the present disclosure, the conductive layer portion 105B may be formed by replacing a semiconductor layer (not illustrated) in the region SOIB by an appropriate electrically conductive material. In accordance with some other illustrative embodiments, the conductive layer portion 105B may be formed by strongly doping a semiconductor layer in the region SOIB by implanting dopants selectively into the semiconductor layer in the region SOIB.

In accordance with some illustrative embodiments of the present disclosure, the semiconductor device structure 100 may comprise a semiconductor device 110A formed in and over the region SOIA, and a capacitor structure 110B formed in and over the region SOIB. The semiconductor device 110A may be formed by a gate structure 111A comprising a conductive gate electrode material 113A formed over the semiconductor layer 105A and separated from the semiconductor layer 105A by a gate dielectric material 115A formed in between the gate electrode material 113A and the semiconductor layer 105A. In accordance with some illustrative examples herein, the gate dielectric material 115A may comprise at least one layer of dielectric material, e.g., at least a layer of a silicon oxide material and at least one layer of a high-k material (k value of 10 or greater) and/or at least one layer of a ferroelectric high-k material. In accordance with some special illustrative examples herein, the gate dielectric material 115A may comprise a hafnium oxide material. In accordance with some illustrative examples, the gate electrode material 113A may be one of amorphous silicon, polysilicon and an electrode metal as known in the art. The gate electrode material 113A may have a silicide portion 117 formed thereon, e.g., nickel silicide and the like.

Referring to FIG. 1, raised source/drain regions 119 may be formed adjacent to the gate structure 111A at opposing sides of the gate structure 111A over the region SOIA. The raised source/drain regions 119 may be formed by epitaxially growing a semiconductor material on the semiconductor layer 105A. In accordance with some illustrative examples herein, the raised source/drain regions 119 may be formed by doped or undoped semiconductor material which may be epitaxially grown on the semiconductor layer 105A. In accordance with some special illustrative examples herein, the raised source/drain regions 119 may comprise silicon, silicon germanium, silicon carbide and the like. A separation between the raised source/drain regions 119 and the gate electrode material 113A may be adjusted by means of a spacer structure 121A, the spacer structure comprising at least one sidewall spacer, e.g., a spacer "zero" and optionally a spacer "one" as known in the art. The spacer structure 121A may comprise at least one layer and may comprise at least one of silicon oxide and silicon nitride. On the raised source/drain regions 119, silicide portions 123 may be provided, the silicide portions 123 being contacted by contacts 125 that land on an upper surface region of the silicide regions 123. The contacts 125 may be formed by a barrier material 124, e.g., TiN, and a contact forming material, e.g., tungsten, contacting an upper surface of the silicide portions 123. Although not explicitly illustrated, the gate structure 111A may be contacted by an according contact (not illustrated), which contacts an upper surface region of the silicide portion of the gate structure 111A. The person skilled in the art will appreciate that the gate contact (not illustrated) may not be present in the sectional view as illustrated in FIG. 1 as the gate contact (not illustrated) may be out of the illustrated paper plane.

Still referring to FIG. 1, the capacitor structure 110B may comprise a first electrode formed by the conductive layer portion 105B which in one embodiment may replace the semiconductor layer in the region SOIB. The capacitor device 110B may further comprise a second electrode 113B formed over the first electrode 105B and separated from the first electrode 105B by means of a dielectric layer 115B. In accordance with some illustrative examples herein, the dielectric layer 115B may comprise at least one sub-layer of dielectric material, e.g., at least a sub-layer of a silicon oxide material and at least one sub-layer of a high-k material and/or at least one sub-layer of a ferroelectric high-k material. In accordance with some special illustrative examples herein, the dielectric layer 115B may comprise a hafnium oxide material.

In accordance with some special illustrative embodiments of the present disclosure, the dielectric layer 115B and the gate dielectric material 115A may be formed by the same dielectric material(s) and/or composition(s).

In accordance with some illustrative embodiments of the present disclosure, the second electrode 113B may be formed over at least a portion of an upper surface of the first electrode 105B, that is, the second electrode 113B may at least partially cover the first electrode 105B when seen in a top view perpendicular to an upper surface region of the region SOIB (direction normal to an upper surface of the conductive layer portion 105B). After a complete reading of the present disclosure, the person skilled in the art will appreciate that a capacitance of the capacitor device 110B may be adjusted by appropriately dimensioning the first electrode 105B and/or the second electrode 113B, and/or selecting an appropriate material for the first electrode 105B and/or the second electrode 113B, and by selecting an appropriate material and/or composition of the insulating material 115B interposed between the first electrode 105 and the second electrode 113B, and by adjusting an appropriate thickness of the insulating material 115B. For example, upon employing a high-k material for the insulating material 115B, high capacitances may be implemented despite possibly reducing geometric dimensions of the first electrode 105B and/or the second electrode 113B.

In accordance with some illustrative embodiments of the present disclosure, the second electrode 113B and the insulating material 115B may form a layer stack of at least two layers, the layer stack being laterally enclosed by a sidewall spacer structure 120. The sidewall spacer structure 120 may be formed by at least one sidewall spacer and may comprise at least one of silicon oxide and silicon nitride and a low-k material and a stress-inducing material layer, e.g., PEN. In accordance with some special illustrative examples herein, the sidewall spacer structure 120 may be formed in parallel to a sidewall spacer structure of the spacer structure 121A of the semiconductor device 110A.

In accordance with some illustrative embodiments of the present disclosure, a dielectric layer 122 may be formed over the layer stack 113B, 115B, the dielectric layer 122 covering an upper surface of the second electrode 113B, the sidewall spacer structure 120 and a portion of an upper surface of the region SOIB not covered by the insulating material 115B. Furthermore, an insulating material layer 121B may be formed overlying the layer stack 111B, similar to the spacer structure 121A, e.g., a cap material of the spacer structure 121A.

In accordance with some illustrative embodiments of the present disclosure, the first electrode 105B may be contacted by a contact 127, the contact 127 extending through the layers 121B, 122 for contacting the first electrode 105B. In accordance with some special illustrative examples herein, the contact 127 and the first electrode 105B may be formed by the same material. In this case, the first electrode 105B is provided by a conductive electrode, e.g., a metal, metal alloy, tungsten and the like. In accordance with some special illustrative examples herein, the contact 127 and/or the first electrode 105B may further comprise a barrier layer 128, the barrier layer 128 enclosing the electrode material of the first electrode 105B and the contact material of the contact 127. In accordance with some special illustrative examples herein, the barrier layer 128 may be formed by a metal, a metal alloy, TiN and the like.

In accordance with some illustrative embodiments, as schematically depicted in FIG. 1, the second electrode 113B may by surrounded by a barrier layer 129, e.g., formed by TiN. Additionally, the second electrode 113B may be contacted by a contact (not illustrated in the sectional view of FIG. 1), similarly to the contact 127 which contacts the first electrode 105B.

In accordance with some illustrative embodiments of the present disclosure, the semiconductor device structure 100 may be employed when forming an embedded DRAM structure (not illustrated) at FEOL and MEOL processing (the contacts 125, 127 are formed during MEOL processing). In accordance with some illustrative embodiments of the present disclosure, the contact 127 to the first electrode 105B may have a first width w1 (that is, a width dimension at least taken in the paper plane of the schematic illustration in FIG. 1) and the contacts 125 may have an according width w2 taken in the paper plane of FIG. 1, wherein w1>w2. In accordance with some special illustrative examples herein, w1>2-3×w2, but this is not limiting by any means. In accordance with some special illustrative but non-limiting examples of the present disclosure, w2 may be in a range from about 25-40 nm.

With regard to FIGS. 2-11, methods of forming a semiconductor device structure in accordance with some illustrative embodiments of the present disclosure will be explained in greater detail below.

Figure 2:
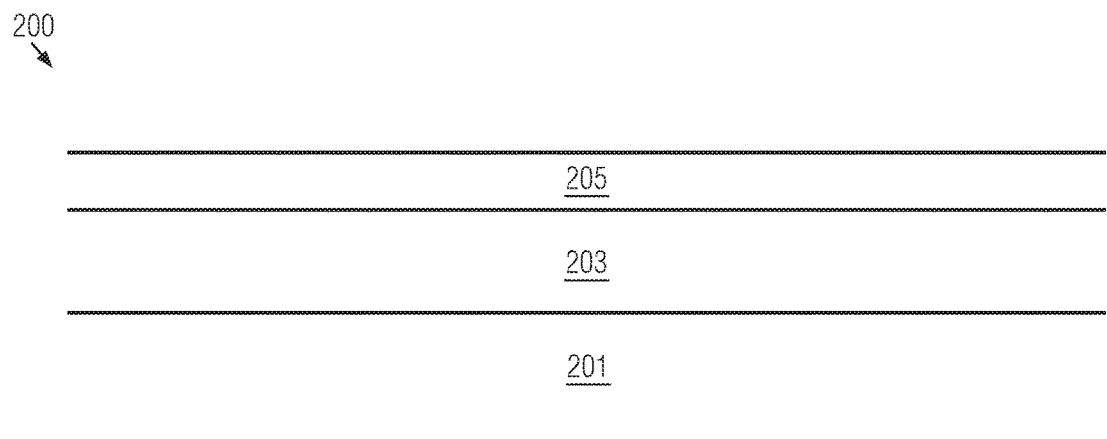
FIGS. 2-11 schematically illustrate a process for forming a semiconductor device structure in accordance with some illustrative embodiments of the present disclosure.

FIG. 2 schematically illustrates a semiconductor device structure 200 at an early stage during fabrication, when a semiconductor-on-insulator (SOI) substrate is provided, the SOI substrate comprising a semiconductor layer 205, a substrate material 201 and a buried insulating material 203 formed between the semiconductor layer 205 and the substrate material 201. The person skilled in the art will appreciate that the SOI substrate may basically correspond to the SOI substrate as described above with regard to FIG. 1. Accordingly, the disclosure of which is incorporated by reference in its entirety.

Figure 3A:
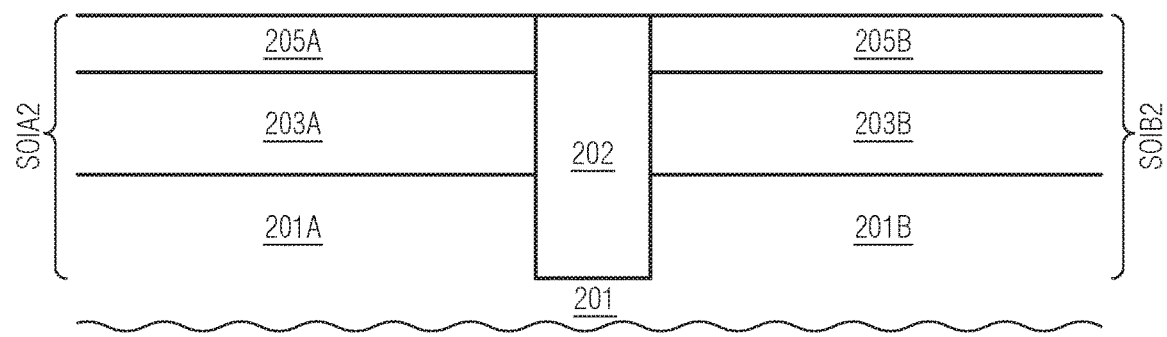

FIG. 3a schematically illustrates the semiconductor device structure 200 at a more advanced stage during fabrication, after a trench isolation structure 202 is formed, the trench isolation structure 202 defining a region SOIA2 and defining a region SOIB2. In accordance with some illustrative embodiments of the present disclosure, the trench isolation structure 202 may separate the regions SOIA2 and SOIB2. In accordance with some special illustrative examples, the trench isolation structure 202 may be similar to the trench isolation structure 102 as described above. For example, the trench isolation structure 202 may be a shallow trench isolation (STI) and/or may be formed in accordance with STI forming techniques. For example, the SOI substrate may be patterned at an early stage during fabrication and trenches (not illustrated) may be etched into the SOI substrate in accordance with the patterning (not illustrated), the trenches (not illustrated) at least extending through the semiconductor layer and into the buried insulating material. For example, the trench (not illustrated) may at least partially extend into the buried insulating material. In accordance with some non-limiting examples, the trench (not illustrated) may be etched into the buried insulating material to expose an upper surface of the substrate material 201 or may be etched into the substrate material 201. Subsequently, the trench (not illustrated) may be filled by an insulating material, such as silicon oxide and/or silicon nitride.

In accordance with some illustrative embodiments of the present disclosure, the trench isolation structure 202 may laterally enclose (at least partially) and separate the regions SOIA2 and SOIB2.

Figure 3B:
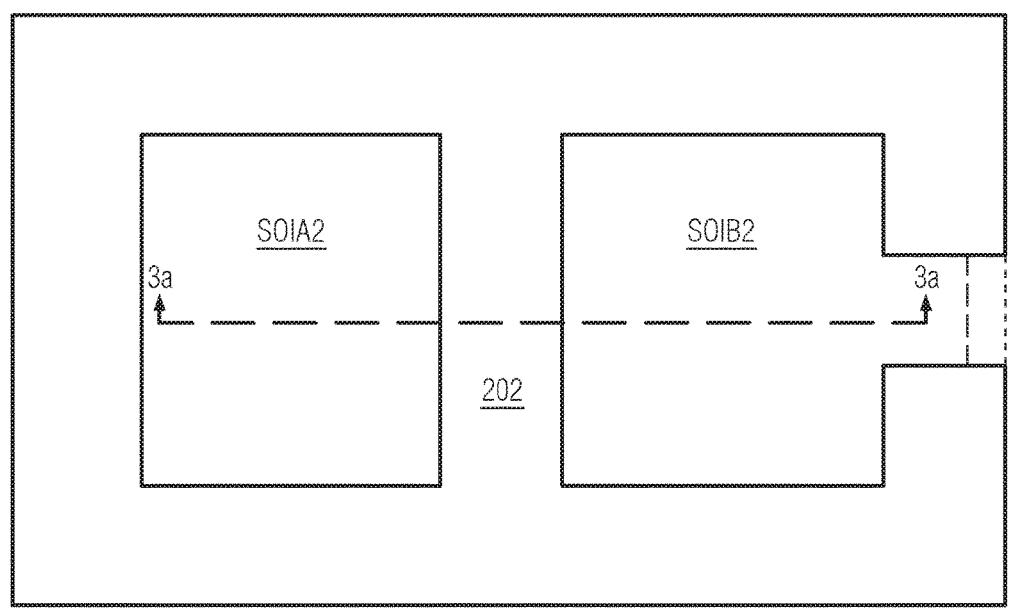

With regard to FIG. 3b, a top view on the SOI substrate is schematically illustrated, wherein the cross-sectional view as schematically depicted in FIG. 3a is indicated in the top view of FIG. 3b by means of line 3a-3a. Accordingly, the region SOIA2 may be laterally enclosed by the trench isolation structure 202. The region SOIB2 may be at least partially enclosed by the trench isolation 202. In accordance with some special illustrative examples herein, the region 501B2 may be laterally enclosed by the trench isolation structure 202 as indicated by the broken line in FIG. 3b, wherein the region SOIB2 may extend into the trench isolation 202 such that, at one side of the region 501B2, a width dimension of the trench isolation structure 202 is reduced. In accordance with some special illustrative examples herein, the width dimension of the trench isolation structure 202 may be reduced at a location along the trench isolation structure, e.g., not at the side of the region SOIB2 facing towards the region SOIA2. In accordance with some illustrative examples, a width dimension of the trench isolation structure 202 extending between the two regions SOIB2 and SOIA1 may not be reduced. This does not pose any limitation to the present disclosure and the person skilled in the art will appreciate that the trench isolation structure 202 may have a substantially homogeneous width dimension along each side of the region SOIB2.

Figure 4:
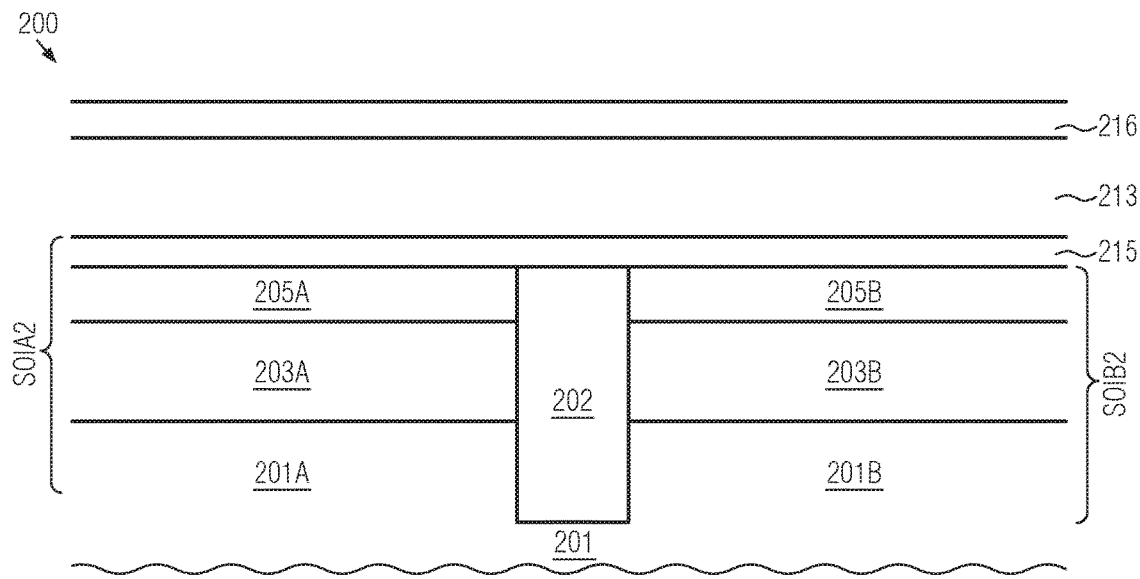

FIG. 4 schematically illustrates the semiconductor device structure 200 at a more advanced stage during fabrication, after a plurality of layers 213, 215, 216 may be formed over the regions SOIA2 and SOIB2. In accordance with some special illustrative examples herein, at least one of the layers 213, 215, 216 may be blanket deposited by at least one of atomic layer deposition (ALD), physical vapor deposition (PVD) and chemical vapor deposition (CVD) techniques.

In accordance with some illustrative embodiments of the present disclosure, a gate dielectric material 215 may be formed over the regions SOIA2 and SOIB2. The gate dielectric material 215 may comprise at least one of silicon oxide, hafnium oxide, silicon oxide nitride, ferroelectric hafnium oxide, a workfunction adjusting material and the like.

In accordance with some illustrative embodiments of the present disclosure, a gate electrode material 213 may be formed over the gate dielectric material 215, the gate electrode material 213 comprising one of polysilicon, amorphous silicon and an electrode metal as known in the art.

In accordance with some illustrative embodiments of the present disclosure, a capping layer 216, e.g., one of silicon oxide and silicon nitride, may be formed on the gate electrode material 213.

Figure 5A:
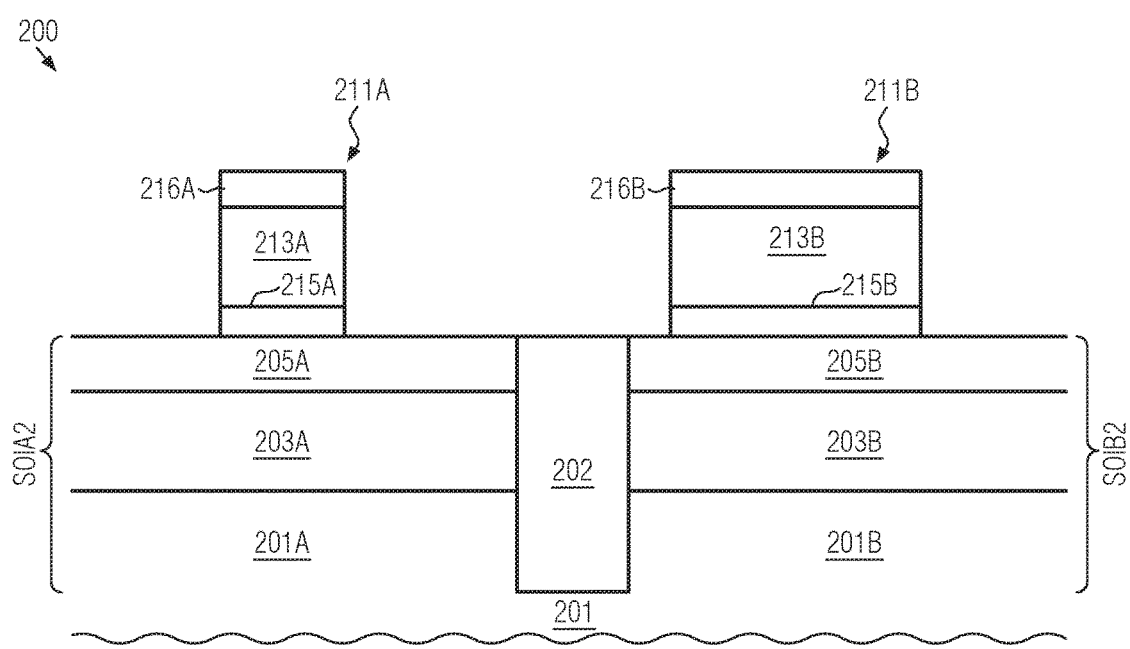

FIG. 5a schematically illustrates the semiconductor device structure 200 at a more advanced stage during fabrication, after the layers 213, 215, 216 are patterned in accordance with known gate patterning techniques, e.g., by means of photolithographic techniques for photolithographically patterning a resist or hard mask formed over the regions SOIA2 and SOIB2, resulting in a gate structure 211A and layer stack 211B over the respective regions SOIA2 and SOIB2. Accordingly, the gate structure 211A may comprise a gate dielectric 215A, a gate electrode 213A and a gate cap 216A. Accordingly, the layer stack 211B may comprise an insulating material 215B formed over the upper surface of the semiconductor layer 205B in the region SOIB2, an electrode layer 213B and a cap layer 216B.

In accordance with some illustrative embodiments of the present disclosure, the layer stack 211B may be formed over the region SOIB2 so as to partially overlay an upper surface of the semiconductor layer 205B in the region SOIB2. In accordance with some special illustrative examples herein, the layer stack 211B may cover at least 50% of an upper surface of the semiconductor layer 205B, e.g., at least 60% of an upper surface of the semiconductor layer 205B or at least 75% of an upper surface of the semiconductor layer 205B or at least 90% of an upper surface of the semiconductor layer 205B, in any case, without covering the entire upper surface of the semiconductor layer 205B.

In accordance with some illustrative examples of the present disclosure, the layer stack 211A and/or the layer stack 211B may have enough extension over the trench isolation structure 202 to allow contacts (not illustrated, contacts are formed at a later stage during fabrication) to land on the layer stack 211A and/or the layer stack 211B without coming in contact with the region SOIA2 and/or the region SOIB2. In a special illustrative example herein, the layer stack 211A and/or the layer stack 211B may extend over the entire region SOIA2 and/or region SOIB2.

Figure 5B:
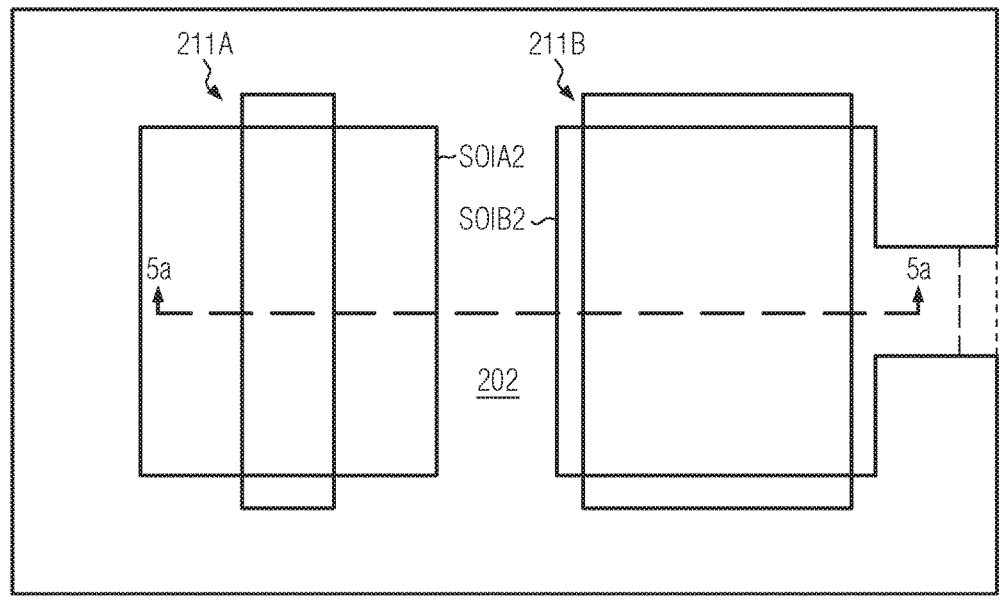

With regard to FIG. 5b, the semiconductor device structure 200 at the stage as described above with regard to FIG. 5a is schematically illustrated in a top view, wherein the cross-sectional view of FIG. 5a is indicated in FIG. 5b by means of a line 5a-5a in FIG. 5b.

Figure 6:
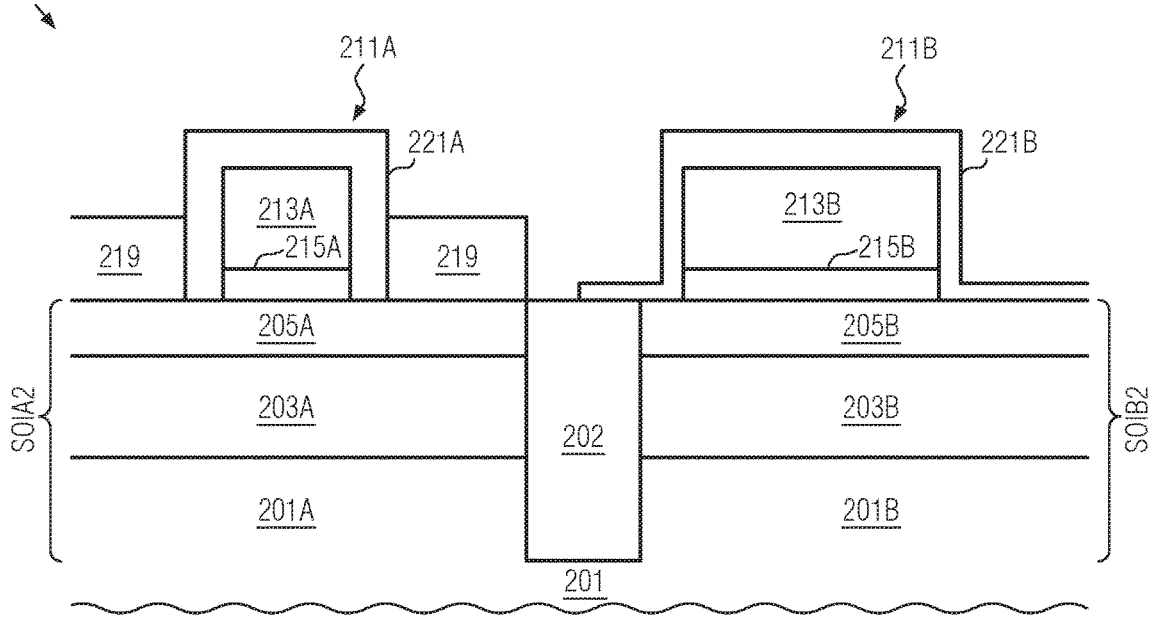

FIG. 6 schematically illustrates the semiconductor device structure 200 at a more advanced stage during fabrication, after an insulating material layer 221B is formed over the region SOIB2, while leaving the region SOIA2 exposed to further processing. According to further processing, as schematically illustrated in FIG. 6, raised source/drain regions 219 are formed in the region SOIA2 adjacent to the gate structure 211A at opposing sides of the gate structure 211A. In accordance with some illustrative examples herein, the raised source/drain regions 219 may be formed by epitaxially growing a doped or undoped semiconductor material on exposed upper surfaces of the semiconductor layer 205A.

In accordance with some illustrative embodiments of the present disclosure, the insulating material layer 221B may be blanket deposited over the regions SOIA2 and SOIB2, followed by masking the insulating material layer 221B over the region SOIB2, exposing the insulating material over the region SOIA2 to an anisotropic etching process, resulting in the spacer structure 221A. Subsequently, the raised source/drain regions 219 may be formed, while the region SOIB2 is protected from further processing by the insulating material layer 221B.

In accordance with some illustrative embodiments of the present disclosure, the raised source/drain regions 219 may comprise silicon, silicon germanium, silicon carbide and the like.

Figure 7:
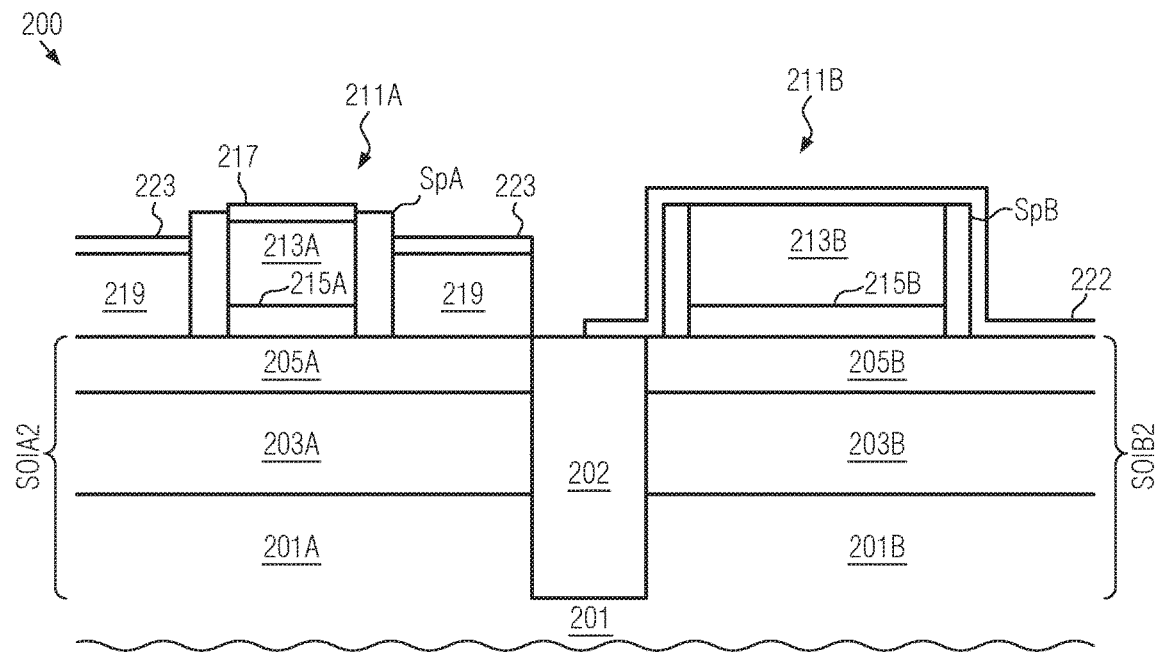

FIG. 7 schematically illustrates the semiconductor device structure 200 at a more advanced stage during fabrication, after silicide portions 223 are formed in and on the raised source/drain regions 219, and silicide portion 217 is formed in and on the gate electrode material 213A. In accordance with some illustrative embodiments of the present disclosure, subsequent to the stage as illustrated in FIG. 6, a process for removing a gate cap of the gate structure 211A may be performed, the process exposing an upper surface of the gate electrode material 213A. At the same time, an upper surface of the electrode material 213B of the layer stack 211B may be exposed. Subsequently, an insulating material layer 222 may be formed over the layer stack 211B and exposed upper surfaces of the semiconductor layer 205B that were exposed in the preceding process, wherein sidewall spacers SpA, SpB may be formed from the spacer structure 221 and insulating material layer 221B in FIG. 6 upon exposing the upper surfaces of the gate electrode material layer 213A and the electrode layer 213B. After having encapsulated the layer stack 211B and protected the remaining exposed surfaces of the semiconductor layer 205B in the region SOIB2 by means of the insulating material layer 222, a silicidation may be performed in the region SOIA2 by depositing a metal material, e.g., nickel, and performing an annealing step for forming silicide portions 223 in a self-aligned manner (that is, silicide portions), as illustrated in FIG. 7. After removing the remaining unreacted metal material, the silicide portions 217 (that is, the self-aligned silicide portions 217, 223 in FIG. 7) remain.

Figure 8:
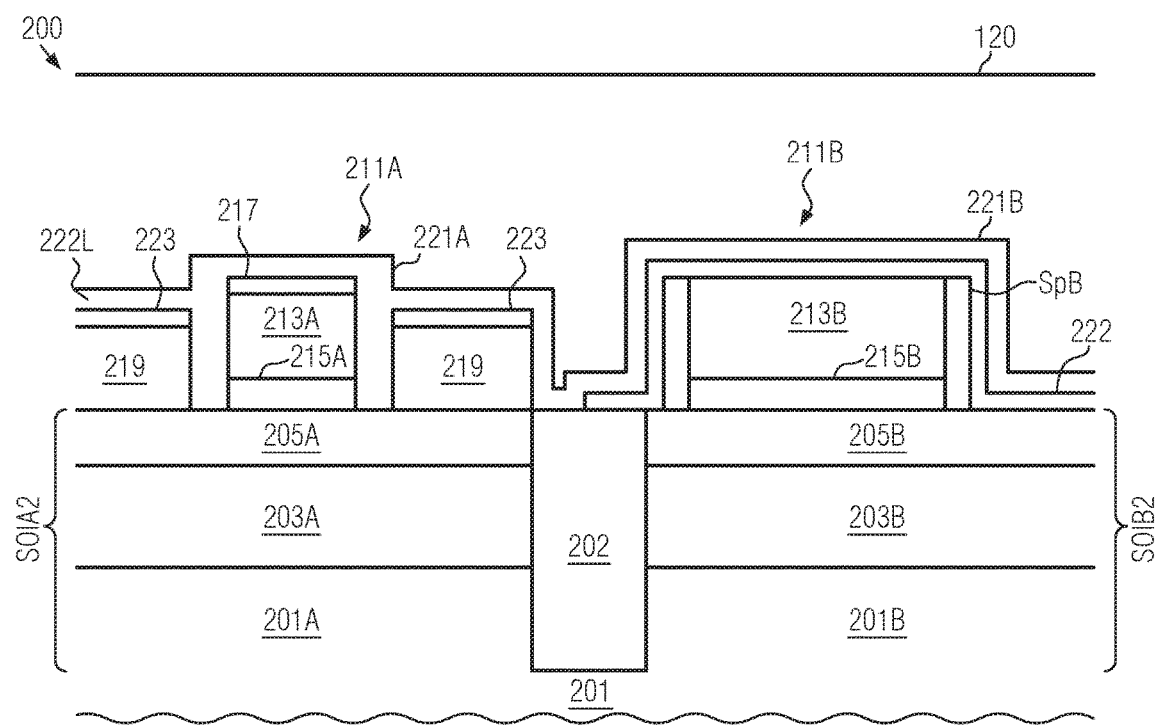

FIG. 8 schematically illustrates the semiconductor device structure 200 at a more advanced stage during fabrication, after an insulating material 222L is deposited over the regions SOIA2 and SOIB2, the insulating material 222L encapsulating each of the regions SOIA2 and 501B2. In accordance with some illustrative embodiments of the present disclosure, the insulating material layer 222L may be a nitride material, e.g., a stress-inducing nitride, such as PEN. Subsequently, an interlayer dielectric ILD 120 may be deposited over the regions SOIA2 and SOIB2, the interlayer dielectric ILD 120 being an interlayer dielectric as known in the art, e.g., a low-k dielectric and the like.

In accordance with some illustrative embodiments of the present disclosure, a planarization process, e.g., chemical mechanical planarization (CMP), may be performed to planarize the interlayer dielectric ILD 120 prior to further processing.

Figure 9:
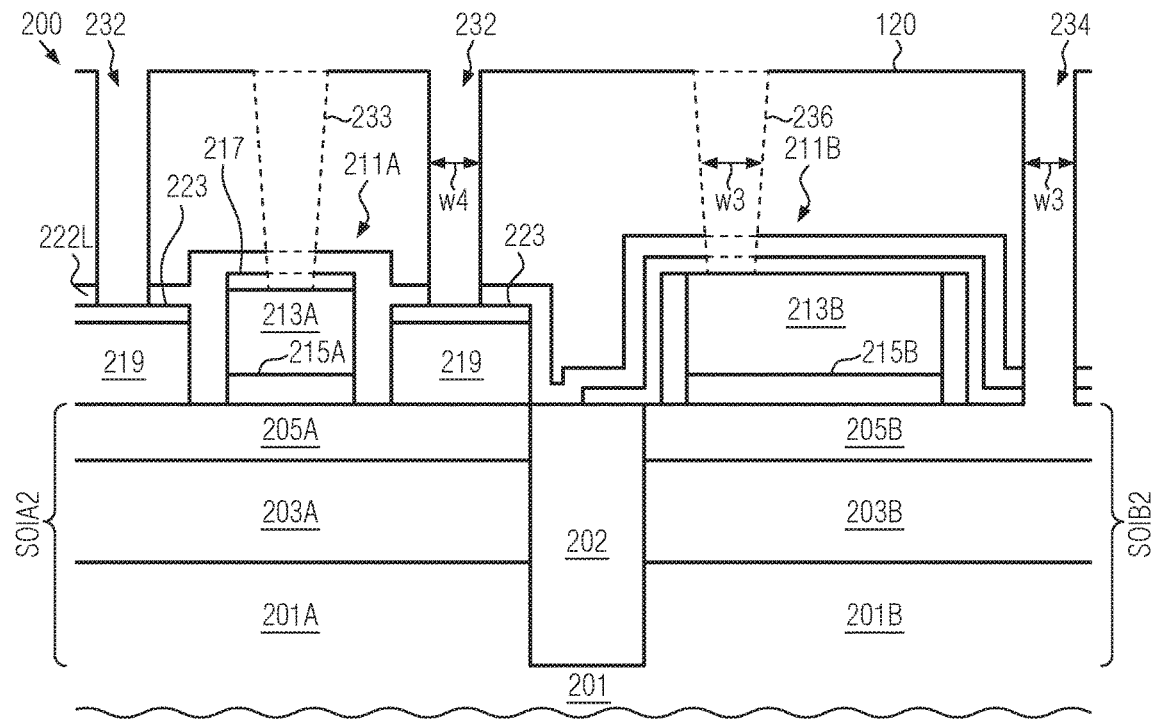

FIG. 9 schematically illustrates the semiconductor device structure 200 at a more advanced stage during fabrication, after a patterning of the interlayer dielectric ILD 120 may be performed and contact holes 232, 233, 234 and 236 are formed in the interlayer dielectric ILD 120. The contact holes 232 extending through the interlayer dielectric 120, the insulating material layer 222L and exposing an upper surface region of the silicide portions 223. The person skilled in the art will appreciate that a contact hole for contacting the silicide portion 217 of the gate structure 211A is not illustrated as this contact hole may be out of the plane of illustration in FIG. 9. However, a contact hole 236 and a contact hole 233 lying outside of the plane of illustration in FIG. 9 are schematically illustrated by broken lines, indicating that the contact hole 233 and the contact hole 236 may not lie in the same plane as the contact holes 232 and 234. The contact holes 233 and 236 expose upper surface portions of the gate structure 211A and the electrode material 213B. The contact hole 234 exposes an upper surface portion of the semiconductor layer 205B adjacent to the layer stack 211B.

In accordance with some illustrative embodiments of the present disclosure, the contact holes 234 and 236 may have a width w3 (that is, a width dimension at least taken in the paper plane of the schematic illustration in FIG. 9) and the contact holes 232 may have an according width w4 taken in the paper plane of FIG. 9 (possibly the contact hole 233, as well, though the width is not taken in the paper plane, but in an according plane parallel to the paper plane), wherein w3>w4. In accordance with some special illustrative examples herein, w3>2-3×w4, similar to the values of w1 and w2 above.

Figure 10:
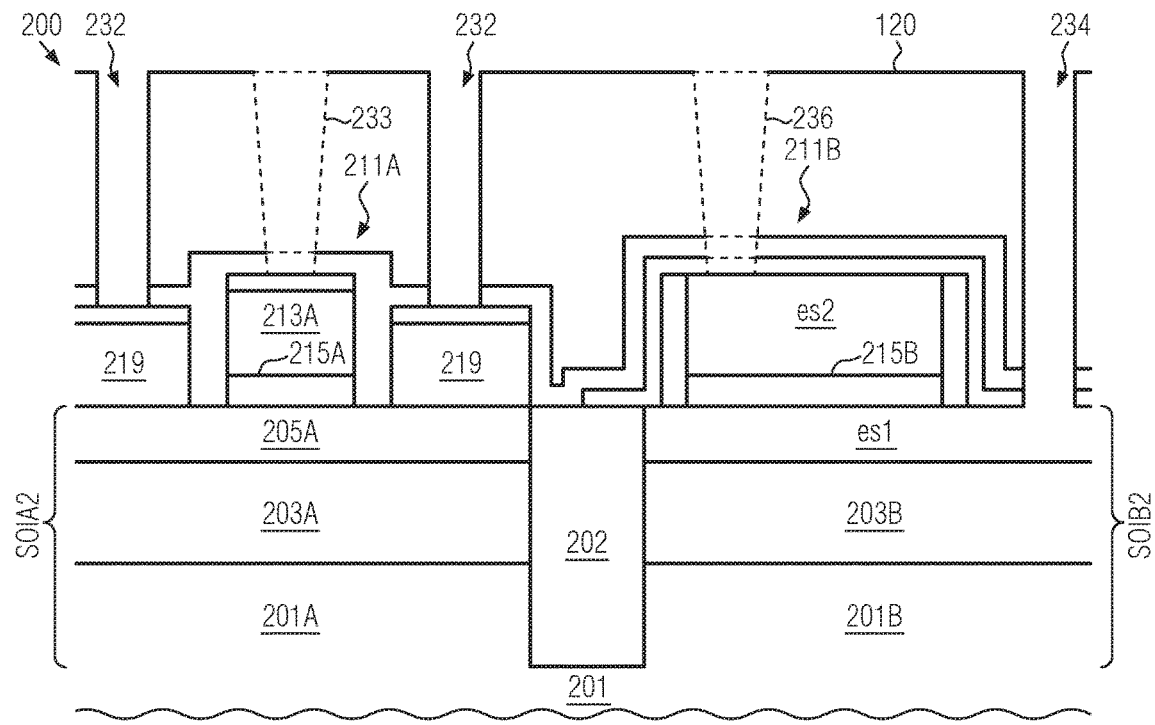

FIG. 10 schematically illustrates the semiconductor device structure 200 at a more advanced stage during fabrication, after an etching process, e.g., a wet etch process, is performed for removing the electrode material 213B and the semiconductor layer 205B through the contact holes 234 and 236, leaving respective empty spaces es1 and es2. The person skilled in the art will appreciate that the region SOIA2 may be protected from the at least one etching process by an appropriate mask.

In accordance with some illustrative embodiments of the present disclosure, two additional separate masking steps may be performed for successively masking each of the contact holes 234 and 236 for successively removing each of the electrode material 213B and the semiconductor layer 205B. That is, one of the contact holes 234 and 236 may be covered, while leaving the other of the contact holes 234 and 236 unmasked for performing a first etching process removing the respective one of the semiconductor layer 205B and the electrode material 213B, removing the mask and masking the other of the contact holes 234 and 236 and performing a further etching process for removing the remaining one of the semiconductor layer 205B and the electrode material 213B. Accordingly, the empty spaces es1 and es2 may be formed.

The person skilled in the art will appreciate that, according to some illustrative embodiments of the present disclosure, at least the contact holes 232 and 234 may be formed in the same mask (not illustrated) together with an appropriate patterning process (not illustrated). It is appreciated that the contact holes land on silicide portions of the semiconductor device 210A, the semiconductor layer 205A is protected from an etchant used to form the contact holes 232 and 233. Accordingly, at least the contact holes 232 and 234 may be formed in parallel.

In accordance with some special illustrative examples herein, at least one TMAH etch may be performed for removing the semiconductor layer 205B and the electrode material 213B, and forming the empty spaces es1 and es2.

Subsequently, the contact holes 232 may be exposed to further processing.

Figure 11:
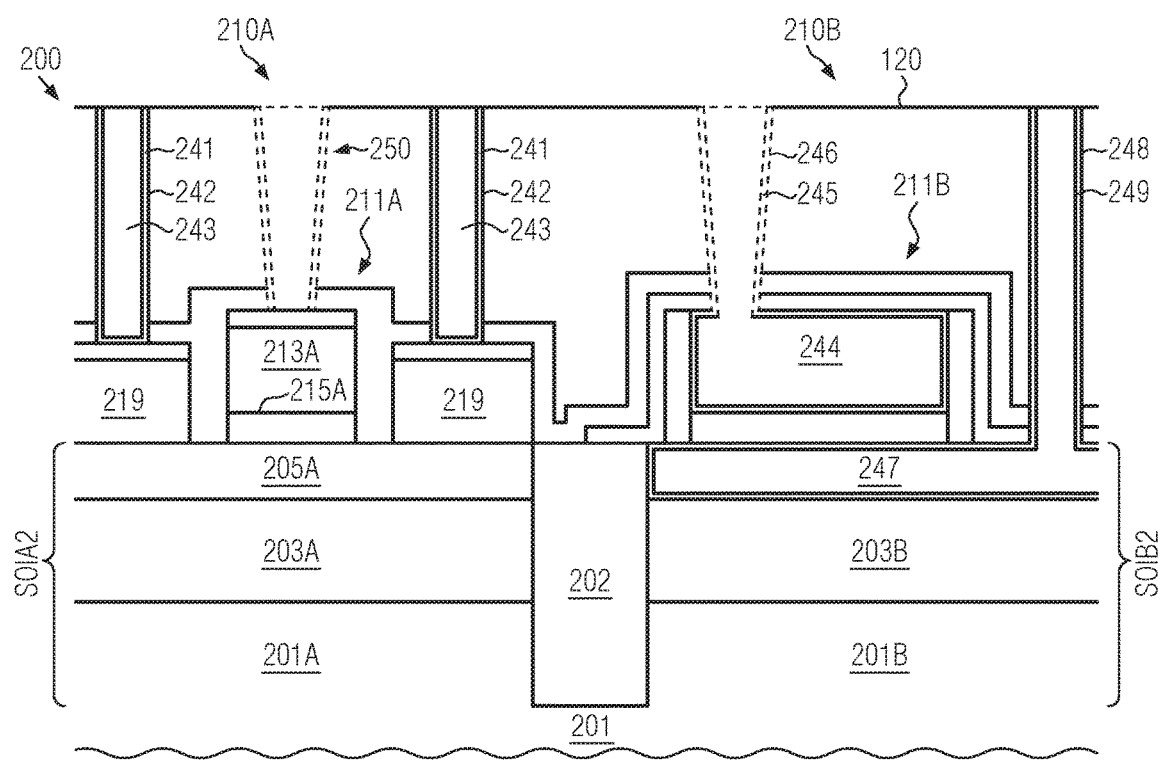

FIG. 11 schematically illustrates the semiconductor device structure 200 at a more advanced stage during fabrication, after a filling process is performed and each of the contact holes 232, 234 and 236 in FIG. 10 are filled by at least one contact forming material.

In accordance with some illustrative embodiments of the present disclosure, the contact holes 232 and 233 in FIG. 10 may be filled by a barrier layer (e.g., conformed deposition of TiN via ALD) and a contact fill (e.g., filling with tungsten by means of CVD), wherein contact 242 comprising the contact material 243 and a barrier layer 241, and a contact 250 comprising a barrier layer and a contact fill are formed over the region SOIA2. Accordingly, a semiconductor device 210A similar to the semiconductor device 110A as described above in FIG. 1 may be obtained.

In accordance with some illustrative embodiments of the present disclosure, the contact hole 236 in FIG. 10 may be filled by a barrier layer (e.g., conformed deposition of TiN via ALD) and a contact fill (e.g., filling with tungsten by means of CVD), wherein a contact 246 comprising the contact material 244 and a barrier layer 245 is formed over the region SOIB2.

In accordance with some illustrative embodiments of the present disclosure, the contact hole 234 in FIG. 10 may be filled by a barrier layer (e.g., conformed deposition of TiN via ALD) and a contact fill (e.g., filling with tungsten by means of CVD), wherein a contact 248 comprising the contact material 247 and a barrier layer 249 is formed over the region SOIB2. Accordingly, a capacitor structure 210B similar to the capacitor structure 110B as described above in FIG. 1 may be obtained.

In accordance with some illustrative embodiments of the present disclosure, the capacitor structure 210B may comprise a first electrode given by the contact material 244 in the layer stack 211B, and a second electrode given by the contact material 247 replacing the semiconductor layer 205B of the region SOIB2.

Although the trench isolation structure 202 is illustrated as being directly adjacent to each of the regions SOIA2, SOIB2, this does not pose any limitation to the present disclosure and the person skilled in the art will appreciate that at least one further trench isolation structure (not illustrated) and/or at least one further semiconductor device (not illustrated) may be formed between the regions SOIA2, SOIB2.

In summary, the above detailed description discloses the following first embodiment providing a semiconductor device structure (100; 200), comprising an SOI substrate comprising a semiconductor layer (105A; 205A, 205B), a substrate material (101, 201) and a buried insulating material layer (103A, 103B; 203A, 203B) between the semiconductor layer and the substrate material, a trench isolation structure (102; 202) formed in the SOI substrate, the trench isolation structure defining a first region (SOIB; SOIB2) and a second region (SOIA; SOIA2), and a capacitor device formed in the first region (SOIB; SOIB2), the capacitor device comprising a first electrode (105B; 247) formed by a conductive layer portion (105B; 247) formed in the first region on the buried insulating material layer, at least partially replacing the semiconductor layer in the first region, a second electrode (113B; 244) formed over the first electrode, and an insulating material (115B; 215B) formed between the first electrode and the second electrode.

In accordance with some special illustrative examples herein, the semiconductor device structure (100; 200) may further comprise the second region (SOIA; SOIA2) separated from the first region by the trench isolation structure, the second region comprising a gate structure (111A; 211A) formed on a gate dielectric material (115A; 215A) disposed on the semiconductor layer (105A; 205A) in the second region.

In accordance with some embodiments of the present disclosure as described above, a capacitor structure, e.g., a MIM capacitor, may be formed during FEOL processing without adding too much complexity to the process flow. In accordance with some illustrative examples herein, a thin semiconductor layer of an SOI substrate may be used and an insulating material of the capacitor structure may be formed in parallel with a gate structure integrated during FEOL processing. Upper and lower electrodes of the capacitor structure are then provided in a self-aligned way relative to the insulating material. In accordance with some illustrative embodiments of the present disclosure, a capacitor structure may be provided using an upper level of an SOI substrate as a lower electrode and a gate level as an upper electrode without additional masking.

In accordance with some illustrative embodiments of the present disclosure, a capacitor structure using an SOI film and gate may be provided, without the need for a trench, without the need for metal electrodes in metallization layers, allowing metallization layer "1" to be exclusively used for routing.

In accordance with some illustrative embodiments of the present disclosure, the electrodes of a capacitor structure may be provided by using a replacement gate-like substitution approach, filling a part of an upper level of an SOI substrate and a gate structure with a contact fill material, e.g., tungsten and, optionally, TiN, in parallel to regular contacts to source/drain regions and/or gate structures. In accordance with some illustrative embodiments of the present disclosure, no new masking steps are required when forming a capacitor structure, wherein an SOI electrode is patterned by an Rx etch (etching active region of the capacitor device), and an upper electrode may be patterned by means of a gate etch.

In accordance with some illustrative embodiments of the present disclosure, two mask options exist, a neutral option where an electrode fill can be combined with a contact film without employing an additional mask, and a one mask option requiring one extra contact mask when forming capacitor contact openings for allowing removal of the semiconductor material of the semiconductor layer of an SOI substrate.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A semiconductor device structure, comprising:
    a semiconductor-on-insulator (SOI) substrate, said SOI substrate comprising a semiconductor layer, a substrate material and a buried insulating material layer positioned between said semiconductor layer and said substrate material;
    a trench isolation structure positioned in at least a portion of said substrate material, said trench isolation structure having a first uppermost surface;
    a capacitor device positioned in a first region adjacent to said trench isolation structure, said capacitor device comprising:
        a first electrode comprising a conductive layer portion positioned in said first region above said buried insulating material layer, the conductive layer portion comprising a metal material, said conductive layer portion having a first lowermost surface positioned at a depth lower than the first uppermost surface of said trench isolation structure and a second uppermost surface positioned at or below the first uppermost surface of said trench isolation structure;
        a second electrode positioned above said first electrode; and
        an insulating material positioned between and contacting said first electrode and said second electrode, wherein said conductive layer portion comprising a metal is positioned directly below a portion of said insulating material that is positioned directly below said second electrode.

2. The semiconductor device structure of claim 1, wherein said second electrode is formed of an electrically conductive material.

3. The semiconductor device structure of claim 2, wherein said electrically conductive material comprises a metal.

4. The semiconductor device structure of claim 2, wherein said first electrode further comprises a barrier material contacting said insulating material, said trench isolation structure, and said buried insulating material layer.

5. The semiconductor device structure of claim 2, wherein said second electrode comprises a barrier material contacting said insulating material, and said barrier material is positioned on sidewalls and a top surface of said second electrode.

6. The semiconductor device structure of claim 1, further comprising a second region separated from said first region by said trench isolation structure, said second region comprising a gate structure positioned on a gate dielectric material disposed on said semiconductor layer in said second region.

7. The semiconductor device structure of claim 6, further comprising source and drain regions positioned at opposing sides of said gate structure.

8. The semiconductor device structure of claim 7, wherein said source and drain regions comprise raised source and drain regions having a silicide contact portion.

9. The semiconductor device structure of claim 8, wherein said silicide contact portion comprises nickel silicide.

10. The semiconductor device structure of claim 6, wherein said gate dielectric material and said insulating material are formed of the same material.

* * * * *